Jan. 25, 1966 H. B. DIAMANT 3,231,758

PULSE GATE

Filed Dec. 12, 1962

INVENTOR.
HENRI B. DIAMANT

BY Hopgood and Calimafde

ATTORNEYS

United States Patent Office 3,231,758

Patented Jan. 25, 1966

3,231,758

PULSE GATE

Henri B. Diamant, State College, Pa., assignor to HRB-Singer, Inc., State College, Pa., a corporation of Pennsylvania Filed Dec. 12, 1962, Ser. No. 244,122
2 Claims. (Cl. 307—88.5)

This invention relates to a pulse gate and more particularly relates to a self-powered AND gate.

The desirability of providing a logical circuit element as a building block for general application which does not require an external source of power is self-evident.

Specifically, this invention is adaptable for use with those computers having program panels through which information signals are translated. It is frequently necessary to modify or add to the logical systems of computers without resorting to internal connections or modifications. I have provided a logical circuit element which will perform in response to the signals which appear on terminals of a program panel and does not require additional power sources.

An object of this invention is to provide a pulse gate which does not require an external power supply and which will perform properly as a pulse coincidence gate or AND circuit as a logical element coupled to the program panel of a standard accounting machine.

Another object of this invention is to provide a self-powered gating circuit.

Still another object of this invention is to provide a self-powered latching circuit which produces output signals depending upon the state of predetermined input signals.

Still another object of my invention is to provide a self-powered AND circuit which responds to coincidence of a predetermined number of $m$ input signals where it is possible to have $n$ input signals.

Briefly, my invention comprises solid state circuit means having at least three electrically coupled pn junctions and three external terminals connected thereto. One external terminal is connected to a load while the other two terminals are connected to different signal inputs. When both of the signal inputs are in a predeterminted state such as coincidence, the solid state circuit means becomes energized to produce an output signal through the load. The load, for example, may be a relay to operate connecting circuitry. One of the inputs is applied to an intermediate pn junction and comprises the trigger input. The signal inputs are obtained directly from operating circuitry such as predetermined terminals on a program panel board of a standard computer. After coincidence of the input signals, the solid state circuit means remains energized. That is, the solid state means remain on after the trigger signal turns off but turns off when the other input signal is turned off.

The solid state device has essentially a thyratron type of characteristic in that the trigger input induces energization (the flow of output current) but does not limit or control it except during the starting conditions. That is, the trigger input signal can actually start operations but cannot stop operations.

The above mentioned and other features and objects of this invention and the manner of attaining them will become more apparent and the invention itself will be best understood by reference to the following description of embodiments of the invention taken in conjunction with the accompanying drawing, in which—

Figure 1:
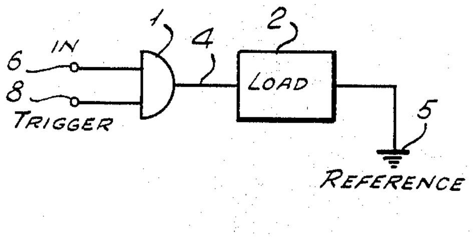
FIGURE 1 is a simple block diagram of the AND circuit of my invention shown connected to a load.

Referring now to FIGURE 1, there is shown an AND circuit 1 and a load 2. The AND circuit 1 is shown in more detail in FIGURES 2–4. The output of the AND circuit 4 is connected directly to the load 2, the other terminal of which may be connected to a reference level terminal 5 which may be ground. The input terminals 6 and 8 are designated as IN and TRIGGER indicating their respective functions. The voltage or current level applied to each terminal 6, 8 may be the same and may be taken from terminals of the program panel board as previously explained.

The AND circuit will turn on only when input and trigger signals are simultaneously applied and when a load is connected. The AND gate will remain on regardless of the signal level at trigged input 8 and turns off only when either the input signal at 6 is terminated or departs from its prescribed state or when the load is disconnected. Since any circuit becomes inoperable when it is opened, it will be assumed as evident that removal of the load will deenergize the circuit and this will not be referred to further as a limiting factor.

Figure 2:
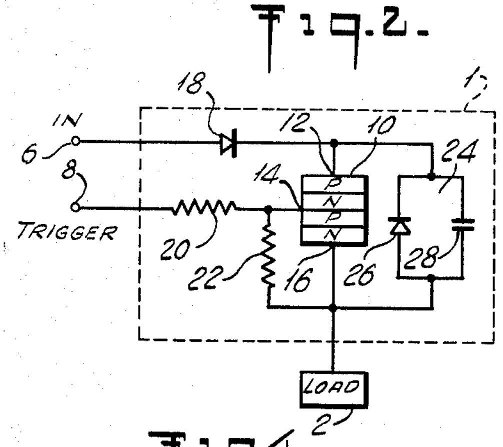
FIGURE 2 is a schematic drawing of a preferred embodiment of the invention using a silicon control rectifier.

Referring now to FIGURE 2, there is shown a four layer diode 10 known as a silicon control rectifier (2N1882) having a collector terminal 12, a base or control terminal 14 and an emitter terminal 16. Input 6 is connected to collector terminal 12 through a forwardly biased rectifier 18 while trigger input 8 is coupled to base 14 through base resistor 20. A base-emitter resistor 22 connects the base and emitter terminals. The collector terminal 12 is also connected to the emitter terminal 16 by means of parallel circuit 24 comprising backwardly biased rectifier 26 and capacitor 28 (0.1 $\mu$f.).

Figure 3:
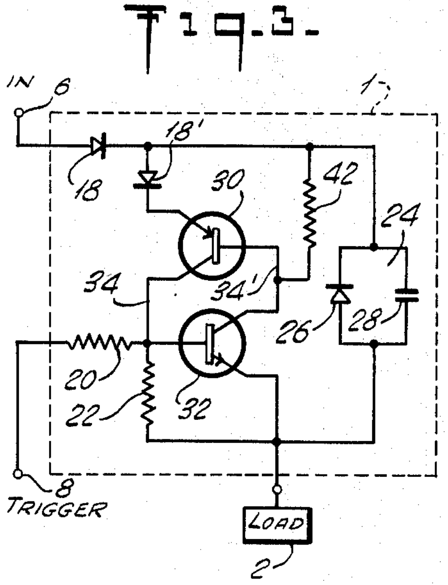
FIGURE 3 is an alternative embodiment as well as an equivalent circuit of the embodiment of FIGURE 2 using two standard junction transistors.

The equivalent circuit as well as an alternative embodiment of the circuit of FIGURE 2 is shown in FIGURE 3 and comprises PNP transistor 30 and NPN transistor 32 connected in feedback relationship. The two PN junctions of transistor 30 correspond to the upper and intermediate PN junctions of four layer diode 10 while the two PN junctions of transistor 32 correspond to the said intermediate and lower PN junctions of the four layer diode.

The operation of circuits of FIGURES 2 and 3 may be further understood by recognizing that the middle PN junction of four layer diode 10 is shared and is common to the PNP and NPN transistor. As shown, there are two forwardly biased diodes 18 and 18′ connected between IN terminal 6 and the emitter of PNP transistor 30. The base of transistor 30 is connected to the collector of NPN transistor 32 by conductor 34′ while the collector of transistor 30 is connected to the base of transistor 32 by conductor 34 to complete the feedback loop. A stabilizing resistor 42 is connected from conductor 34′ to a terminal between diodes 18 and 18′. Parallel circuit 24 is connected from the emitter of transistor 32 to the terminal between diodes 18 and 18′. A load 2 is connected to the emitter of transistor 32.

A trigger signal on lead 8 and applied to the base of NPN transistor 32 (FIGURE 3) will be amplified and applied to the base of PNP transistor 30 over lead 34′. The output from the collector of transistor 30 is fed back over lead 34 to the base of transistor 32. This feedback operation continues causing breakdown unless the voltage level at the emitter of transistor 30 is so low such that the emitter is negative with respect to the base. A more detailed discussion of the operation of the four layer diode may be found in Joyce and Clark, Transistor Circuit Analysis, page 199 (1961).

Figure 5:
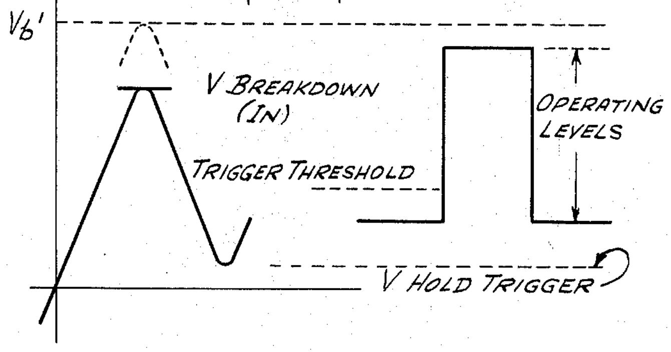
FIGURE 5 is a simplified diagram of the characteristics of the solid state device of this invention.

The characteristic of the four layer diode 10 is well known and is shown for illustration purposes in FIGURE 5. The characteristic resembles that of a thyratron inasmuch as breakdown is essentially a function of two voltages. When the input voltage reaches the breakdown level as illustrated and the trigger voltage is at a predetermined level, breakdown will occur. The dotted level $V_{b'}$ is intended to suggest that a much higher or "ultimate" breakdown voltage would be required if the trigger voltage were not at the predetermined threshold value. It will be seen that if the input and trigger voltage are coincidentally at the upper operating levels indicated at FIGURE 5, breakdown occurs. When the trigger voltage ceases the pulse gate remains on. However, the presence of only one of the two input voltages below an ultimate level $V_{b'}$ will not be sufficient to start conduction.

Figure 6:
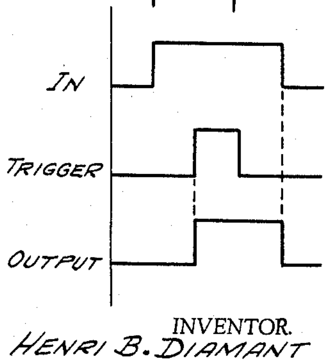
FIGURE 6 is a pulse timing diagram showing the inputs and output of my invention.

The operational characteristics of this invention may be seen by referring to FIGURE 6. The initiation of the IN signal will not cause any output until the trigger signal is applied. Yet, when the trigger signal stops, the output does not change until the IN signal ceases.

Specific examples of circuit elements from one embodiment of this invention are here illustrated:

| | |
|---|---|
| Resistors: | |
| 20 | 27K |
| 22 | 1.8K |
| 36 | 470K |
| 38 | 33K |
| 42 | 1K |
| Load 2 | 10K |
| Capacitor 28 ____ μf | .01 |
| Diodes: | |
| 26 | IN–698 |
| 37 | IN–751 |
| R1 . . . R*n* ____ each | 470K |
| Signal operating level ____ volts | 50 |

Figure 4:
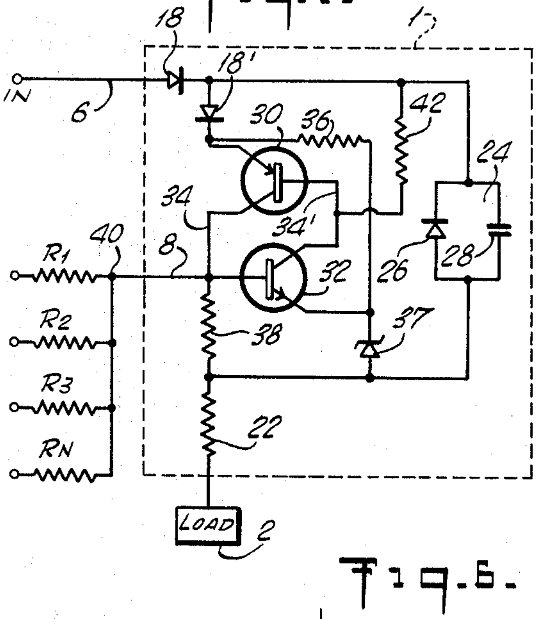
FIGURE 4 is still another embodiment of this invention employing a plurality of input resistors for providing AND resistor logic.

An alternative embodiment of this invention employing resistor AND logic for controlling the threshold of the trigger signal is shown in FIGURE 4. FIGURE 4 differs from FIGURES 2 and 3 in the use of a Zener diode 37 in series connection with a current resistor 36 which is connected across the semiconductor device as well as in using a high resistance 38 in series with resistor 22. A predetermined number of resistors $R_1$, $R_2$, $R_3$ . . . $R_n$ have one end connected to respective input signal sources and have their other end connected to common terminal 40. These resistors form esentially an adding circuit. Zener diode 37 in conjunction with base emitter resistor 38 provides a threshold bias which must be overcome by the sum of the inputs which appears at terminal 40. When a signal appears on IN terminal 6, Zener diode 37 is broken down and establishes a current path therethrough. The break-down voltage over the Zener diode establishes the bias.

The particular bias which must be overcome may be judiciously selected in accordance with the number of input signals which are desired. Hence, the circuit may be designed so that every one of the inputs which is to be applied to resistors $R_1$ . . . $R_n$ must be present or it may be desired that only a predetermined number *m* of the total number *n* possible signals must be present to overcome the bias.

My pulse gate under specific conditions performs some very useful latching and unlatching functions since it latches on or follows the state of one of the input signals and then turns off and responds to a predetermined condition of the other.

Semi-conductor devices which exhibit thyratron type characteristics may be used in connection with the principles of this invention in place of the multi-junction semiconductive means heretofore described.

While the foregoing description sets forth the principles of the invention in connection with specific apparatus, it is to be understood that this description is made only by way of example and not as a limitation of the scope of the invention as set forth in the objects thereof and in the accompanying claims.

What is claimed is:

1. An AND gate whose output is energized when an input and a control voltage are simultaneously in a prescribed state and whose output is thereafter deenergized only when a predetermined one of said inputs departs from said prescribed state,
 said gate being powered only by said first and second inputs,
 said AND gate comprising
 multiple unit semi-conductor means comprising
 at least three PN junctions, the N terminal of a first junction being coupled to the P terminal of a second junction, and the N terminal of the second junction being coupled to the P terminal of the third junction,
 input voltage means coupled across the P terminal of said first junction and the N terminal of said third junction to forwardly bias said first and third junctions and rearwardly bias said second junction,
 control voltage means coupled to said second junction,
 said semi-conductor means having a breakdown voltage threshold which is a function of the control voltage, and said semi-conductor means having a hold voltage threshold,
 said input voltage being less than said breakdown voltage in the absence of a prescribed state of said control voltage, but sufficient to cause breakdown when said control voltage is in said prescribed state,
 said prescribed state being above said hold voltage,
 and adding means having a plurality of inputs coupled to said control voltage means to produce a signal of threshold level when a predetermined number of inputs are present,
 said input voltage means including a forwardly biased diode connected to said P terminal,
 said control voltage means including a first series resistor, and a second resistor connected from said first series resistor to said N terminal of said third junction,
 a load connected from said N terminal of said third junction
 and a parallel circuit comprising a capacitor and a reversely biased diode connected from the P terminal of the first junction to the N terminal of the third junction,
 said input voltage means including a Zener diode coupled between said second and third junctions, whereby when an input voltage is applied, said Zener diode is operated at breakdown level and thereby the threshold level for said control signal is reduced.

2. An AND gate whose output is energized when an input and a control voltage are simultaneously in a prescribed state and whose output is thereafter deenergized only when a predetermined one of said inputs departs from said prescribed state,
 said gate being powered only by said first and second inputs,
 said AND gate comprising
 multiple unit semi-conductor means comprising
 at least three PN junctions, the N terminal of a first junction being coupled to the P terminal of a second junction, and the N terminal of the second junction being coupled to the P terminal of the third junction,
 input voltage means coupled across the P terminal of said first junction and the N terminal of said third junction to forwardly bias said first and third junctions and rearwardly bias said second junction, control voltage means coupled to said second junction, said semi-conductor means having a breakdown voltage threshold which is a function of the control voltage, and said semi-conductor means having a hold voltage threshold, said input voltage being less than said breakdown voltage when said control voltage is not in said prescribed state, said input voltage being sufficiently large to cause breakdown when said control voltage is in said prescribed state, said prescribed state being above said hold voltage, said input voltage means including a Zener diode coupled between said second and third junctions, whereby when an input voltage is applied, said Zener diode is operated at breakdown level and thereby the threshold level for said control signal is reduced, said input voltage means including a forwardly biased diode connected to said P terminal, said control voltage means including a first series resistor, and a second resistor connected from said first series resistor to said N terminal of said third junction, a load connected from said N terminal of said third junction and a parallel circuit comprising a capacitor and a reversely biased diode connected from the P terminal of the first junction to the N terminal of the third junction.

References Cited by the Examiner

UNITED STATES PATENTS

| | | | |
|---|---|---|---|
| 2,655,609 | 10/1953 | Shockley ---------- | 307—88.5 |
| 3,065,360 | 11/1962 | Vallese ------------ | 307—88.5 |

OTHER REFERENCES

"Application and Circuit Design Notes," Solid State Products, Inc., Bulletin D420–02, pages 4, 15, 19 and 20, December 1959.

ARTHUR GAUSS, *Primary Examiner.*